United States Patent [19]

O'Brien

[11] 4,065,716
[45] Dec. 27, 1977

[54] APPARATUS FOR DISPLAYING A BAND REPRESENTATION OF A SIGNAL

[75] Inventor: Rory Morgan O'Brien, Hitchin, England

[73] Assignee: Alfred Herbert Limited, Coventry, England

[21] Appl. No.: 772,273

[22] Filed: Feb. 25, 1977

[30] Foreign Application Priority Data

Feb. 27, 1976 United Kingdom ................ 7910/76

[51] Int. Cl.² ........................................... G01R 31/00
[52] U.S. Cl. ..................... 324/96; 324/122; 340/378 R
[58] Field of Search ............ 324/96, 122, 103 R, 324/99 D; 340/324 R, 378 R; 356/227

[56] References Cited

U.S. PATENT DOCUMENTS

| 3,796,951 | 3/1974 | Joseph | 324/122 |
| 3,969,672 | 7/1976 | Wallander | 324/122 X |
| 4,017,796 | 4/1977 | Tobias | 324/96 X |

Primary Examiner—Stanley T. Krawczewicz
Attorney, Agent, or Firm—Haseltine, Lake & Waters

[57] ABSTRACT

Apparatus for displaying a band representation, e.g. a bar graph or column graph, of a signal comprises a series connected array of light-emission devices such as LED.s and a preferably constant current source connected to one end of the series. Transistorised control means is arranged to bypass the constant current around selected ones of the devices in dependence upon the magnitude of an input signal to be displayed so that the devices remaining lit form a band representation of the signal. A center-zero display is provided by applying an offset voltage to the input signal.

14 Claims, 3 Drawing Figures

APPARATUS FOR DISPLAYING A BAND REPRESENTATION OF A SIGNAL

INTRODUCTION

This invention relates to apparatus for displaying a band representation of a signal, for example a representation of a signal in the form of a bar graph or a column graph where the length of a lit bar or column represents the magnitude, say, of the signal.

Early examples of such apparatus were electromechanical in nature and comprised an electrical measuring and servo-system coupled to a movable coloured band or ribbon which was moved, by the servo-system, along behind a plate having a viewing slit in it so that the visible length of the band represented the signal.

Proposals have also been made for apparatus wherein the mechanical part of the apparatus mentioned above is replaced by a closely spaced array of electrical light emission devices, such as light emitting diodes (LED.s), which lamps are selectively lit, in dependence upon the signal to be displayed, so that the lit ones form a column or bar of length representative of the signal.

One such proposal, disclosed by Kalnin et al in an article entitled "Application of Light-emitting diode Matrices in Measurement Engineering" (Instrum. and Exp. Tech., Jan-Feb 1972, pp 163-164, 324/96), provides a simple and accurate system wherein current is passed through a chain of silicon diodes so as to form, at the interconnection points between the diodes, a series of voltages differing by steps of about 0.7 Volts. The emitter of a respective transistor is connected to each interconnection point between two diodes, the base of each transistor being coupled via resistors and, probably, an amplifier to the voltage input signal to be displayed and the collector load of each transistor comprising a light-emitting diode and a resistor in series. Thus as the input signal varies through the range of the series of voltages at the interconnection points of the diode chain, the number of light-emitting diodes which are lit varies and these light-emitting diodes can be physically arranged to form a bar graph. The circuit can be considered as a plurality of comparators set to compare the input signal against voltages differing by 0.7 Volts. A disadvantage of the Kalnin et al proposal is that where the number of LED.s required is large, over 50 say, so as to give good resolution of the display, the amplified input voltage applied to the base of the transistors has to sweep through quite a large range, i.e. to light the highest value LED the voltage applied to the base of the associated transistor has to be around 50 × 0.7 Volts, and such voltage levels exceed those available from a conventional integrated circuit which cannot therefore be used as the input signal amplifier. One solution of this problem is disclosed in U.S. Pat. No. 3,961,256 assigned to the present assignee. Here a plurality of integrated circuit operational amplifiers are used as the comparators and a resistor chain forms the series of comparison voltages. With this solution, the steps between the comparison voltages can be reduced to say 100 mV or even less. However, although it is proposed in this specification to use multiplexing techniques to reduce the number of comparators required, it is still necessary to use several of these items and, as each one is quite a costly item, the overall cost of the apparatus can be substantial.

Accordingly, it is an object of the invention to provide band representation display apparatus having an array of light-emitting devices to form the band, wherein the voltage levels appearing at certain points within the apparatus can be substantially lower than is necessary with the Kalnin proposal and which can be substantially cheaper to produce than the other proposal mentioned above. It is a further object of the invention to provide such apparatus wherein, by the use of a kind of negative feedback circuit, the accuracy and stability of the display is substantially improved.

BRIEF DESCRIPTION OF THE INVENTION

According to the invention, there is provided band representation display apparatus comprising:

an array of electrical light-emission devices which are physically positioned for forming a band representation and which are electrically connected in series with one another, continuous electrical current supply means which is connected to one end of the series of light-emission devices and which is operable for making continuous electrical current available to flow through the series to light the devices control means which is connected to an input terminal of the apparatus and to said devices and which is operable for receiving an input signal applied to said input terminal and for bypassing said continuous electrical current past a number of said devices in dependence upon said input signal so that a band representation of said signal is formed by the devices remaining lit.

Preferably said light-emission devices are light-emitting diodes (LED's). The supply means may comprise a constant current source. It is particularly advantageous for both of these latter features to be present, i.e. for the devices to be light-emitting diodes and for the supply means to comprise a constant current source because when such diodes are fed by a constant current source they have a very accurately predictable characteristic as regards the voltage dependence of the light emitted from them.

DESCRIPTION OF THE ACCOMPANYING DRAWINGS

DETAILED DESCRIPTION

Figure 1:
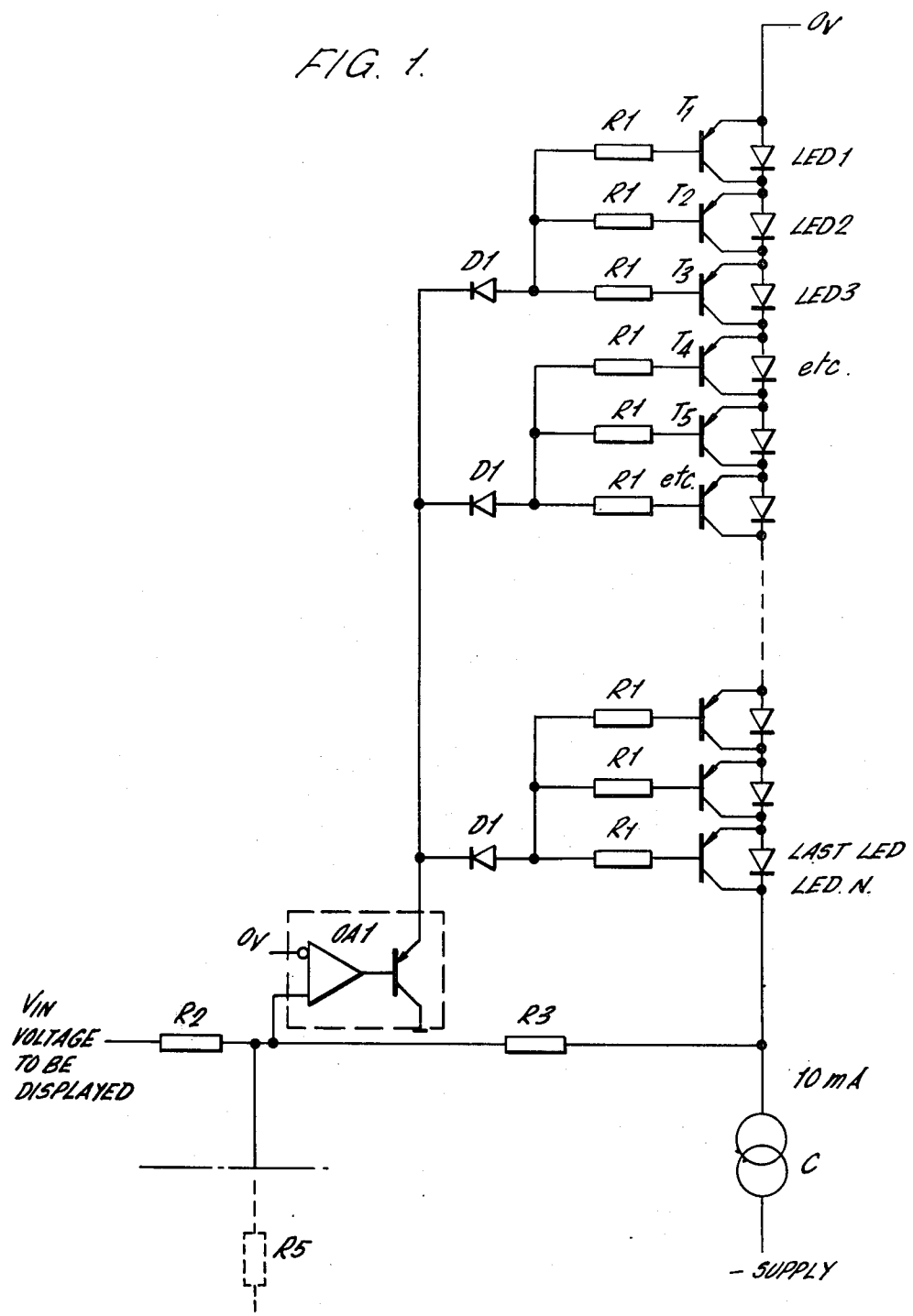
FIG. 1 is a circuit diagram of band representation display apparatus.

The apparatus of FIG. 1 comprises an array of light-emitting diodes (LED's) LED1, LED2 —LEDN which are connected in series with one other between a zero voltage supply line and a negative polarity constant continuous current source C. Under the action of the source C, current passes through the series arrangement of diodes to cause them to be lit. The collector and emitter terminals of a respective PNP transistor T1, T2, —TN are connected to one and the other side respectively of each light-emitting diode. The base of each transistor has a respective input resistor R1. The input sides of each three adjacent input resistor are commonly connected to the anode of a diode (D1) which is respective to those three resistors. The cathodes of all the diodes D1 are connected in common to the output of an operational amplifier OA1 of which the inverting input is taken to the 0V supply line while the non-inverting input is connected to receive, via a resistor R2, the signal voltage Vin of which a band representation is to be displayed, and via a feed back resistor R3 to that end of the series chain of LED's which is connected to the current source C.

If the signal voltage Vin to be displayed is positive, the output of the operational amplifier will tend to be positive, all the transistors will be switched off and all LED's will be lit. Assuming there are 50 LED's in the chain and each LED drops approximately 1.63v, the voltage at the current source end of the chain will be −81.5v and this is fed back to the non-inverting input of the amplifier OA1. The values of the resistors R2 and R3 are such that R2/R3 = F/V where V is the voltage level at the current source end of the diode chain when all the diodes are lit and F is the maximum input voltage magnitude to be represented by the display, i.e. the "full scale" input voltage, for example R2 can be 1KΩ and R3 can be 81.5KΩ when the "full scale" input voltage is 1 Volt. Then, if the signal voltage Vin starts to fall below 1V., the output of the operational amplifier will commence to go negative and the base of the transistor T1 will approach the point where T1 will conduct and short out LED1, i.e. it will by-pass the supply energy past this diode which will therefore cease to be lit. When this happens, the voltage at the current source end of the chain of LED's will fall so as to reduce the feedback to the amplifier by 1.63v. If the input voltage falls further towards 0V., T2 will start to conduct, LED2 will be extinguished, and the voltage dropped across the chain will be further reduced. This process will continue as the voltage Vin to be displayed goes further towards 0V until all the LED's are extinguished.

The LED's are physically positioned, in a column or row for example, so as to form a closely spaced array of LED's whereby the diodes which remain lit for a particular value of input signal voltage form a band representation of the input signal. For example, the array could be linear so that the band representation is in the form of a column or bar graph. As a further example, the array could have an arcuate shape. The components included in the feedback circuit of the operational amplifier include the lit LED's and the voltage dropped across these is dependent on their number, i.e. on the number of LED's not shorted out by the transistors. Thus, the natural action of the feedback loop is to give the required band representation.

In the illustrated circuit, the transistors only have to withstand a low voltage, for example 1.6v between emitter and collector, even though the voltage across the chain is more than 80v. Further, since the feedback resistor R3 is connected to a virtual earth, the operational amplifier does not have excessive voltage at its input and, since the shorting action of each transistor reduces the voltage across each LED from approximately 1.63 to the saturated VCE of the transistor, for example 100mV, the voltage on the emitter of the last transistor will only be about 8 volts when all LED's are extinguished. Thus, the output of the amplifier does not need to be excessive. The only components in the illustrated circuit which are individually subjected to the full supply voltage of about 80 volts are the diodes D1. When all the LED's are lit a large negative voltage is applied to the anode terminals of each of the diodes D1 and they will not therefore conduct. Thus, the voltage across each of the resistors R1 is minimal and, in addition, the base terminals of the transistors are protected. Diodes able to withstand such a voltage level are readily and cheaply available.

The function of the diodes D1 is to prevent Zener breakdown of the base-emitter diodes of the transistors and so the number of diodes D1 can be selected as desired, for example there could be one diode D1 for each transistor or one diode for a number of transistors other than three. The choice of one diode to three transistors is advantageous however because the sum of the voltage drops across three typical LED's of the kind used in the illustrated circuit will be 4.9 volts which is within the limit of cheap silicon planar transistors.

Figure 2:
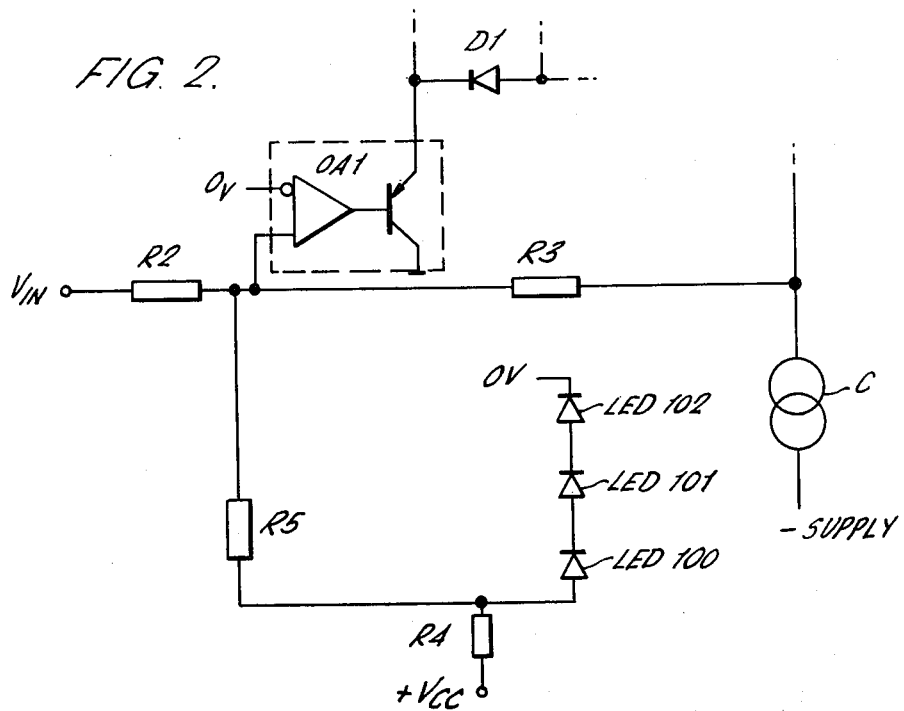
FIG. 2 is a circuit diagram of an addition which may be made to the FIG. 1 apparatus to make it give a centre zero display.

With a column or bar graph display, it is often desirable for the mid-point of the display to represent a zero value of the input signal voltage. This can be achieved by use of the circuit shown in FIG. 2 where three light-emitting diodes LED 100 to LED 102 and a resistor R4 are connected in series between the zero and positive supply lines of a source of potential VCC to form a voltage divider the value of R4 being chosen to ensure that a suitable level of current, say 10 mA, flows through the divider. The point of connection between the resistor R4 and the light-emitting diode LED 100 connected thereto is connected to the non-inverting input of the amplifier OA1 in FIG. 1 by way of a resistor R5. The number of light-emitting diodes, such as LED 100-102, connected in series with the resistor R4 could be other than three and, in fact, this number, and also the value of the resistor R5, are chosen such that the voltage level appearing at the non-inverting input to the amplifier OA1 when the signal voltage Vin is zero is just sufficient to ensure that one half of the array of diodes LED1, LED2 —LEDN are lit and the other half extinguished. There is thus provided a centre zero display. The voltage divider of FIG. 2 is used to produce an offset voltage to the input of the amplifier OA1. The diodes LED 100 to 102 are used to form one limb of the voltage divider so that any variation in the voltage resulting from changes in temperature shall correspond to the variation in voltage across each of the diodes LED 1 to N, thereby giving better stability in the number of lit diodes when the input to be displayed is zero.

Figure 3:
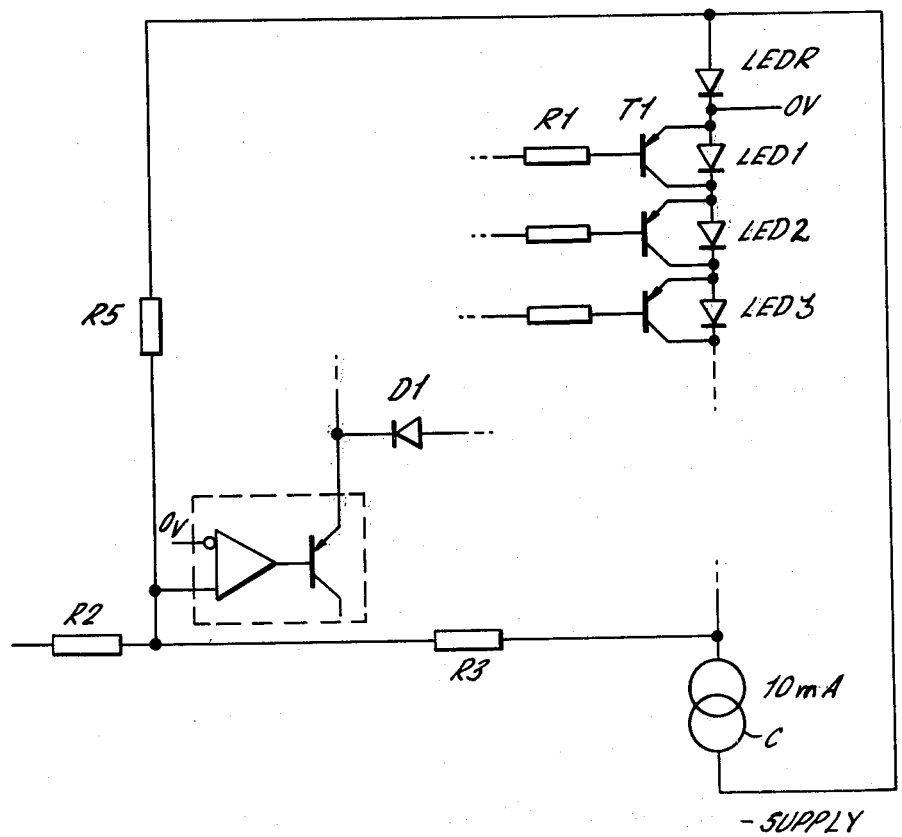
FIG. 3 is a circuit diagram of an alternative addition which may be made to the FIG. 1 apparatus to make it give a centre zero display.

An alternative means of producing the above-mentioned offset voltage is shown in FIG. 3. Here, the constant current source C is a floating supply and an additional light-emitting diode, LED.R, is added at the positive end of the chain of diodes LED1 —LEDN so that the constant current passes through diode LED R. The junction between the cathode of diode LED R and diode LED1 is held at zero potential. The resulting positive potential at the anode of diode LED.R is then used as the offset voltage and is fed via resistor R5 to the amplifier OA1. The circuit of FIG. 3 is preferred to that of FIG. 2 because, in it, the current flowing through diode LED.R will always be the same as that flowing through the chain of diodes LED1 —LEDN. Thus, the voltage produced across the diode LEDR will more closely equal that across the lit ones of diodes LED 1 to N and the stability of the number of lit diodes when the input to be displayed is zero is further improved.

Using arrangements similar to those of FIGS. 2 and 3 but adjusting the component values and such, as required, the apparatus could be made such that a zero input voltage is represented by a band of lit diodes of length other than half the total length of the array of diodes LED1, LED2 —LEDN, i.e. to give an intermediate zero but not necessarily a centre zero.

The diodes LED 100-102 and LED R are preferably light-emitting diodes of the same type as the diodes LED1, LED2 —LEDN and they will be lit all the time that the constant current is supplied. Thus, the diodes LED 100-102 in FIG. 2 of LED R in FIG. 3 can be used to provide an indication that the apparatus is switched on.

It will be seen that there are only three interconnections between the display section of the illustrated circuit (namely the display diodes LED 1 to N, resistors R1 and diodes D1) and the measuring and energy supply section (the amplifier OA1, the current source C, and the supply lines). Thus the display section can be provided as a separate unit with only three wired connections to be measuring section, each section preferably being formed as a printed circuit. Alternatively, the two sections can form parts of a complete printed circuit device. As a further possibility, a group of say ten series connected light-emitting diodes with the associated transistors T1 and resistors R1, and with or without one or more associated protective diodes D1, could be combined as a structural unit, for example as an integrated circuit, such a unit may have only three terminals, i.e. the two terminals connected to the respective ends of the group of diodes and the common terminal connected to the transistor bases by way of the resistors R1 and diode(s) D1 if present. Then, to form a display, several of the units could be taken and connected in series, and the supplementary circuitry, i.e. the source C, amplifier OA1 and resistors R2 and R3 added as appropriate. Integrated circuit units comprising linear arrays of light-emitting diodes are already commercially available but, in them, the diodes are kept electrically separate within the circuit unit. By modifying the design of such units, i.e. so that the diodes are in series and the transistors, resistors and possibly also the protective diodes are provided, there is provided a unit of which a desired number can be purchased and very easily connected together to form a desired kind of band display apparatus.

In the illustrated embodiment, the feedback path between the amplifier OA1 and the point of interconnection between the current source C and the diode LED N comprises a simple, series resistor R3. The effect of this is to give linear negative feedback and consequently a linear band display, i.e. one in which the length of the lit column or band is (provided that the light-emitting diodes LED 1 to LED N are equidistantly spaced from one another) linearly related to the magnitude of the input signal. It will be appreciated however that the form of the negative feedback could be modified so as correspondingly modify the form of the display. By way of example, the resistor R3 could be replaced by a non-linear device, for example a diode or an arrangement of several diodes, having a logarithmic transfer function so as to give a correspondingly logarithmic display.

I claim:

1. Band representation display apparatus comprising:
    a plurality of electrical light-emission devices which are physically positioned for forming a band representation and which are electrically connected in series with one another,
    electrical current supply means which is connected to one end of the series of light-emission devices and which is operable for making electrical current available to flow through the series to light the devices,
    control means including a plurality of switch means, which switch means are connected across respective associated ones of said devices and which are each operable for bypassing said continuous electrical current past the associated device,
    a conductive portion for receiving an input signal of which a band representation is to be displayed, and
    feedback means which is connected to said series arrangement and which is operable for delivering a negative feedback signal representative of the sum of the potential difference(s) across the lit light-emission device(s),
    said control means being connected to said conductive portion and said feedback means to receive said input signal and said negative feedback signal, and being operable to bypass said current past a number of said devices in dependence upon said input signal so that a band representation of said signal is formed by the devices remaining lit.

2. Apparatus according to claim 1, wherein the light-emission devices are light-emitting diodes (LED's).

3. Apparatus according to claim 1, wherein said supply means comprises a constant current source.

4. Apparatus according to claim 1, wherein said switch means each comprise transistor switch means.

5. Apparatus according to claim 4, wherein each transistor switching means comprises a transistor which has its emitter and its collector connected on one and the other side respectively of the respective associated one of the light-emission devices, the bases of all the transistors being connected to a common conductor portion to which there is also connected
    the output of control voltage forming means which is operable for forming at its output a transistor control voltage representative of the said input signal.

6. Apparatus according to claim 5, wherein said control voltage forming means comprises a comparator amplifier to one comparison input of which is applied a reference level and to the other comparison input of which there is applied said input signal.

7. Apparatus according to claim 1, wherein said control means is operable for causing a zero value of said input signal to be represented by a band terminating intermediate the ends of the array of devices.

8. Apparatus according to claim 7, wherein said control means comprises, for causing said zero value to be represented by a band terminating intermediate the ends of the array of devices as aforesaid, means for forming, and for combining with the input signal, an offset voltage.

9. Apparatus according to claim 8, wherein said offset voltage forming means comprises a voltage divider of which one limb comprises one or more further light-emission devices.

10. Apparatus according to claim 8, wherein said offset voltage forming means comprises a further light-emission device one side of which is connected to one end of said array of light-emission devices, the interconnection point between the array and the further device being held at zero volts and said supply means, which is constructed for providing a floating current supply, being connected to the other end of said array and to the other side of the further device, said offset voltage being taken from said other side of said further device.

11. Apparatus according to claim 1, wherein said feedback means is connected between the said one end of the series of devices and the said conductive portion.

12. Apparatus according to claim 6, wherein said comparator amplifier is an integrated circuit operational amplifier with an inverting input and a non-inverting input.

13. Apparatus according to claim 5, wherein the bases of the transistors are connected to said common conductor portion by way of a plurality of protective diodes there being fewer diodes than transistors so that the bases of at least some of the transistors are connected through a diode through which the base of at least one other transistor is connected.

14. Apparatus according to claim 13, wherein there is one protective diode for each three adjacent transistors.

* * * * *